(12) United States Patent
Horiuchi et al.

(10) Patent No.: US 6,256,207 B1
(45) Date of Patent: Jul. 3, 2001

(54) CHIP-SIZED SEMICONDUCTOR DEVICE AND PROCESS FOR MAKING SAME

(75) Inventors: Michio Horiuchi; Shigetsugu Muramatsu, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/347,909

(22) Filed: Jul. 6, 1999

(30) Foreign Application Priority Data

Jul. 6, 1998 (JP) .................................................. 10-190468

(51) Int. Cl.[7] ........................................................ H05K 1/18
(52) U.S. Cl. .......................... 361/760; 361/765; 361/772; 361/777; 361/783; 361/807; 174/255; 174/260; 174/262; 174/266; 257/737; 257/786; 257/783; 257/738
(58) Field of Search ..................................... 361/760, 765, 361/772, 777, 783, 807, 820; 174/250, 255, 260, 262, 266; 257/737, 786, 778, 783, 738, 785

(56) References Cited

U.S. PATENT DOCUMENTS

| | | | |
|---|---|---|---|
| 5,013,900 | * 5/1991 | Hoppe | 235/492 |
| 5,203,076 | * 4/1993 | Banerji et al. | 29/840 |
| 5,677,576 | * 10/1997 | Akagawa | 257/785 |
| 5,684,330 | * 11/1997 | Lee | 257/692 |
| 5,766,982 | * 6/1998 | Akram et al. | 438/51 |
| 5,818,697 | * 10/1998 | Armezzani et al. | 361/749 |
| 5,834,844 | * 11/1998 | Akagawa et al. | 257/734 |
| 5,925,934 | * 7/1999 | Lim | 257/778 |
| 6,054,772 | * 4/2000 | Mostafazadeh et al. | 257/781 |
| 6,075,710 | * 6/2000 | Lau | 361/760 |

FOREIGN PATENT DOCUMENTS 6-140473   5/1994 (JP) .

* cited by examiner

Primary Examiner—Jayprakash N. Gandhi
Assistant Examiner—David Foster
(74) Attorney, Agent, or Firm—Pennie & Edmonds LLP

(57) ABSTRACT

A chip-sized semiconductor device includes a semiconductor element having a plurality of electrodes and a plurality of connecting pads electrically connected to the respective electrodes. A connecting board includes a base substrate having a first surface and a second surface, a plurality of connecting holes extending from the first surface to the second surface, a plurality of lands formed on the first surface to close the respective connecting holes, the lands being arranged in conformity with positions of the connecting pads of the semiconductor element, each of the connecting pads having a surface area smaller than that of the land. The semiconductor element is mounted on the connecting board in such a manner that the connecting pads of the semiconductor element are electrically connected to the respective lands of the connecting board by means of a plurality of bumps, respectively. A plurality of external connecting terminals on the second surface of the base substrate to be in contact with the respective lands through the respective connectings holes.

16 Claims, 4 Drawing Sheets

CHIP-SIZED SEMICONDUCTOR DEVICE AND PROCESS FOR MAKING SAME

BACKGROUND OF THE INVENTION

1. Field of the Invention

The present invention relates to a semiconductor device, particularly to a semiconductor device having substantially the same size as a semiconductor element or chip itself, hereinafter referred to as "chip-sized semiconductor device or package" and a process for making the same.

2. Description of the Related Art

A chip-sized package is a semiconductor device which has a substantially the same size as a semiconductor chip itself, in which a mounting substrate has a substantially the same size as a semiconductor chip and has external connecting terminals, such as solder balls, on a mounting surface thereof so that a semiconductor chip can be mounted on the mounting substrate by means of the external connecting terminals. Usually, the chip-sized package is a multi-pin type in which the external connecting terminals are arranged in a array on the mounting surface thereof.

FIG. 5 shows an example in which the lands 14 for connecting the external connecting terminals are arranged on the mounting surface of the semiconductor element 10. The semiconductor element 10 has electrodes 12 on the surface thereof. Wiring patterns 16 connect the electrodes 12 to the lands 14, respectively.

One example of methods for arranging the lands 14 on an electrode forming surface of the semiconductor element 10 is that, wiring patterns 16 are first formed on a passivation film of a semiconductor element 10 and then lands 14 are formed at the tip ends of the wiring patterns 16. Another example is that a wiring pattern film, used as an interposer, is first arranged on the electrode forming surface of the semiconductor element 10 and wiring patterns are then formed on the film to connect the lands 14 to the lands 14 and to the electrodes 12, so that the electrodes 12 are electrically connected to the lands 14, respectively.

In any case, it is necessary that the land, which is connected to the external connecting terminal, has a diameter of about 300 μm. Therefore, if the lands 14 are arranged by themselves on the electrode forming surface of the semiconductor element 10, the spaces between the adjacent lands 14 will be very narrow and therefore the space for arranging the wiring patterns 16 are restricted. If the electrodes 12 are densely arranged and the number of pins is increased, the number of wiring patterns for connecting mutually between the electrodes and the lands will be increased and it will become difficult to preserve the enough spaces for arranging the wiring patterns 16.

If the wiring patterns 16 cannot be arranged on the electrode forming surface of the semiconductor element 10, a multi-layer structure of wiring patterns 16 must be used. However, such a multi-layer structure will make it difficult and complicated to produce the semiconductor devices, thereby reducing the reliability thereof.

Even if a wiring pattern film is arranged, as an interposer, to electrically connect the lands 14 to the electrodes 12 of the semiconductor element 10, forming such a wiring pattern film is complicated and also a connecting operation between the lands 14 and the electrodes 12 will be complicated and troublesome.

SUMMARY OF THE INVENTION

An object of the present invention is to provide a chip-sized semiconductor device or package and a process for making the same, in which a multi-pin structure of such a package with a simple construction can easily be obtained and such a package can easily be made with a low cost.

According to the present invention, there is provided a chip-sized semiconductor device comprising: a semiconductor element having a plurality of electrodes and a plurality of connecting pads electrically connected to the respective electrodes; a connecting board comprising a base substrate having a first surface and a second surface, a plurality of connecting holes extending from the first surface to the second surface, a plurality of lands formed on the first surface to close the respective connecting holes, the lands being arranged in conformity with positions of the connecting pads of the semiconductor element, each of the connecting pads having a surface area smaller than that of the land; the semiconductor element being mounted on the connecting board in such a manner that the connecting pads of the semiconductor element are electrically connected to the respective lands of the connecting boards by means of a plurality of bumps, respectively; and a plurality of external connecting terminals on the second surface of the base substrate to be in contact with the respective lands through the respective connectings holes.

A plurality of wiring patterns are provided on an electrode forming surface of the semiconductor element to electrically connect the respective electrodes to the respective connecting pads.

The base substrate is made of an electrically insulating material, such as resin, and the first surface of the base substrate is covered with an electrically insulating protective film in such a manner that a part of the respective land is exposed to define a contact portion, to which the respective bump is to be adhered, the contact portion having a surface area smaller than that of the land.

A gap defined between the semiconductor element and the connecting board is filled with an electrically insulating underfill.

According to another aspect of the present invention, there is provided a chip-sized semiconductor device comprising: a semiconductor element having a plurality of electrodes and a plurality of connecting pads electrically connected to the respective electrodes; a connecting board comprising a base substrate having a first surface and a second surface, a plurality of connecting holes extending from the first surface to the second surface, a plurality of lands formed on the first surface to close the respective connecting holes, the lands being arranged in conformity with positions of the connecting pads of the semiconductor element, each of the connecting pads having a surface area smaller than that of the land; and the semiconductor element being mounted on the connecting board in such a manner that the connecting pads of the semiconductor element are electrically connected to the respective lands of the connecting board by means of a plurality of bumps, respectively.

According to a further aspect of the present invention, there is provided a package for mounting thereon a semiconductor element, the package comprising: a connecting board comprising a base substrate having a first surface and a second surface, a plurality of connecting holes extending from the first surface to the second surface, a plurality of lands formed on the first surface to close the respective connecting holes, the lands being arranged in conformity with positions of connecting pads of a semiconductor element which is to be mounted on the connecting board, each of the lands having a surface area larger than that of the connecting pads; and a plurality of external connecting terminals on the second surface of the base substrate to be in contact with the respective lands through the respective connectings holes.

According to still further aspect of the present invention, there is provided a process for making a chip-sized semiconductor device, the process comprising the steps of: preparing a connecting board comprising a base substrate having a first surface and a second surface, a plurality of connecting holes extending from the first surface to the second surface, a plurality of lands formed on the first surface to close the respective connecting holes, the lands being arranged in conformity with positions of connecting pads of a semiconductor element which is to be mounted on the connecting board, each of the lands having a surface area larger than that of the connecting pads; mounting the semiconductor on the connecting board in such a manner that the connecting pads of the semiconductor element are electrically connected to the respective lands of the connecting board by means of a plurality of bumps, respectively; and providing a plurality of external connecting terminals on the second surface of the base substrate to be in contact with the respective lands through the respective connectings holes.

In this connection, a plurality of external connecting terminals may be first provided on the second surface of the base substrate to be in contact with the respective lands through the respective connectings holes; and then the semiconductor can be mounted on the connecting board in such a manner that the connecting pads of the semiconductor element are electrically connected to the respective lands of the connecting board by means of a plurality of bumps, respectively.

DETAILED DESCRIPTION OF THE EMBODIMENTS

Figure 1:
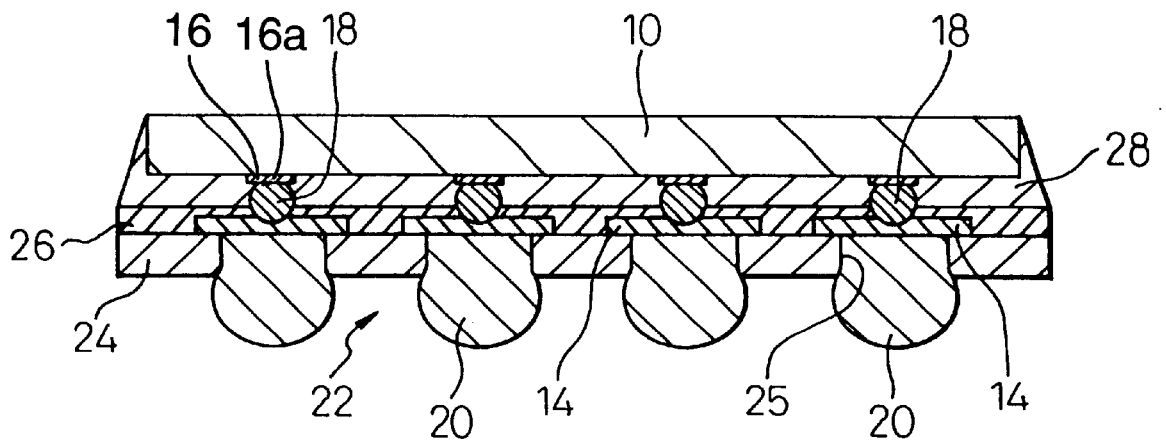
FIG. 1 is a cross-sectional view of an embodiment of a chip-sized semiconductor device according to the present invention.

Referring now to the drawings, wherein FIG. 1 is a cross-sectional view of an embodiment of a chip-sized semiconductor device according to the present invention.

The chip-sized semiconductor device comprises a semiconductor chip 10 having an electrode forming surface and a connecting board 22 on which lands 14 are formed in the same arrangement as external connecting terminals 20. The semiconductor chip 10 is mounted on the connecting board 22 in such a manner that electrodes of the semiconductor chip 10 are electrically connected to the external connecting terminals 20.

The semiconductor device further comprises bumps 18 provided between the connecting board 22 and the semiconductor chip 10 to electrically connect the semiconductor chip 10 to the external connecting terminals 20.

According to one embodiment of this invention, the bumps 18 are concentrically arranged with the lands 14 adhered to the external connecting terminals 20. Therefore, the semiconductor chip 10 is provided with connecting pads 16a on the electrode forming surface corresponding to the arrangement of the bumps 18 so that the connecting pads 16a are electrically connected to the lands 14 by means of the bumps 18.

The connecting pads 16a are electrically connected to the electrodes 12 of the semiconductor chip 10 by means of the wiring pattern 16. The wiring patterns 16 are extending on the electrode forming surface of the semiconductor chip to connect the electrodes 12 to the connecting pads 16a.

Figure 2:
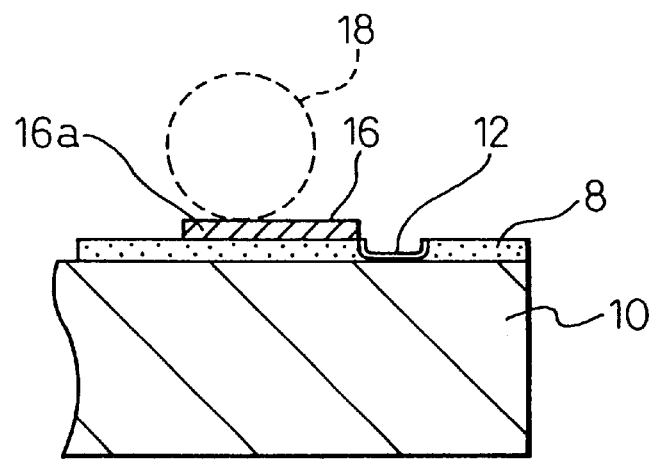
FIG. 2 is a cross-sectional view showing a wiring pattern formed on the semiconductor chip.

FIG. 2 shows a wiring pattern 16 formed on the electrode forming surface of the semiconductor chip 10. The respective wiring pattern 16 has its one end connected to an electrode 12 on a passivation film 8 and its other end being formed as the connecting pad 16a. The connecting pad 16a has an area necessary for adhering the bump 18. Although the connecting pad 16a is adhered to the bump 18, it can also be used as a testing pad for testing to determine whether the semiconductor chip 10 is acceptable or not, before the semiconductor chip 10 is mounted on the wiring board 22.

In the embodiment shown in FIG. 1, the bump 18 is adhered to the connecting pad 16a provided on the electrode forming surface of the semiconductor chip 10.

The connecting board 22 comprises an electrically insulating base substrate 24, made of such as a resin, on which lands 14 are formed in accordance with the planner arrangement of the external connecting terminals 20. The connecting board 22 is also provided with connecting holes 25 through which the outer surface of the lands 14 are exposed to contact with the external connecting terminals 20.

The respective external connecting terminals 20 are provided in the connecting holes 25 so that the lands 14 are electrically connected to the external connecting terminals 20. The lands 14 are electrically connected to the respective connecting pads 16a by means of the respective bumps 18 so that the semiconductor element 10 is electrically connected to the external connecting terminals 20 through the electrodes 12 of the semiconductor element 10, the wiring patterns 16, the connecting pads 16a, bumps 18 and the lands 14.

Although the bump 18 is concentrically arranged with the land 14 in the semiconductor device according to this embodiment, the relationship in arrangement between the bumps 18 and lands 14 are not limited to this embodiment, but any other arrangements are available, as far as the positions of the respective bumps 18 mutually corresponds to the positions of the respective lands 14.

According to this embodiment, solder balls, each having a diameter of 300 μm, are used as the external connecting terminals 20 and the land 14 has a diameter of 400 μm which is a little larger than the diameter of the solder ball 20. On the other hand, the bump 18 has a diameter which is smaller than that of the external connecting terminal 20. In this embodiment, solder balls, each having a diameter of 50 μm, are used as the bumps 18.

Since the bump 18 has a relatively small diameter, the wiring patterns 16 can easily be formed around the electrode forming surface of the semiconductor element 10 and therefore the external connecting terminals 20 can easily be positioned in accordance with a predetermined arrangement. If lands, each having a large diameter of 300 μm, are arranged on the electrode forming surface of the semiconductor element 10, a wide space will be required for the arrangement of the lands and thus a space for the wiring patterns 16 will be strictly limited. On the other hand, if lands, each having a small diameter, are arranged the wiring patterns 16 will more easily be arranged because only the connecting pads 16a, each having a small area required for bump 18, are formed on the electrode forming surface of the semiconductor element 10. Therefore, such an arrangement is much advantageous, particularly if the electrodes 12 are densely arranged or if there are a large number of pins.

Therefore, the bump 18 can be so selected that it has a diameter sufficient to easily arrange the wiring patterns 16. If a number of the electrodes 12 of the semiconductor element is not so much or if the electrodes 12 are not so densely arranged, it is unnecessary to significantly reduce the diameter of the bump 18. The connecting pads 16a can be formed so as to correspond to the dimension of the bump 18. Usually, the diameter of the bump 18 is appropriately 50 to 200 µm.

On the other hand, if a number of the electrodes 12 of the semiconductor element is large or if the electrodes 12 are so densely arranged, it will be difficult to arrange the necessary wiring patterns 16 on a single layer. In such a case, a plurality of layers of the wiring patterns 16 should be formed on the electrode forming surface. In this case, the connecting pads 16a are also identically arranged as the arrangement of the external connecting terminals 20 and the respective pads 16a mutually correspond to the external connecting terminals 20, respectively.

A protective film 26 is provided to protect the lands 14 on the substrate base 24 to cover the connecting board 22, so that the areas of the protective film 26 which is to be in contact with the bumps 18 are exposed on the surfaces of the lands 14.

The base substrate 24 serves to support the lands 14 and the external connecting terminals 20 and to moderate the thermal stress caused on the difference in the thermal coefficient between the mounting substrate and the semiconductor element 10. Therefore, the material of the base substrate 24 should be an electrical insulator and, in addition to this, it should be a necessary resilient material. For example, a resin film, such as a polyimide film or others, can advantageously be used, as the base substrate 24.

As shown in FIG. 1, an underfill 28 is used to seal the gap between the semiconductor element 10 and the connecting board 22. Since the semiconductor element 10 is connected to the connecting board 22 by means of the bumps 18, there remains a gap between the electrode forming surface of the semiconductor element 10 and the mounting surface of the connecting board 22. Therefore, the underfill 28 seals this gap. In place of the underfill 28 which completely seals the gap, the outer periphery of the gap of the semiconductor element 10 and the connecting board 22 only may be sealed.

Figure 3A:
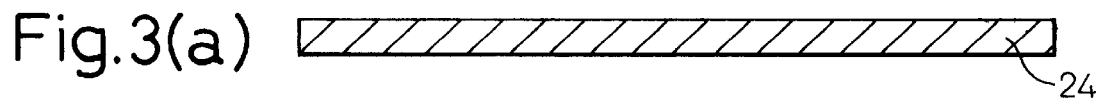
FIGS. 3(a) to 3(g) show respective steps for making a connecting board used in this invention.

FIGS. 3(a) to 3(g) show respective steps for making a connecting board used in this invention. FIG. 3(a) shows a base substrate 24 used in the connecting board 22. The base substrate 24 is an electrically insulating material, for example a resin, such as polyimide, polyphenyleneether, epoxy or the like, glass cloth or polymer unwoven cloth containing these resin. In one embodiment, a polyimide film having a thickness of 75 µm was used.

Figure 3B:
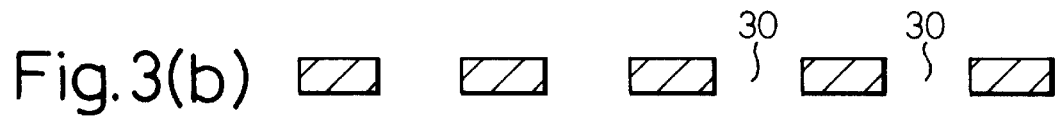

The base substrate 24 is provided with through holes for connecting the external connecting terminals 20, as shown in FIG. 3(b). In the embodiment, the through holes have a diameter of 300 µm and arranged regularly in X and Y-directions at a pitch of 500 µm. In the embodiment, the through holes were easily formed by a punching process.

Figure 3C:
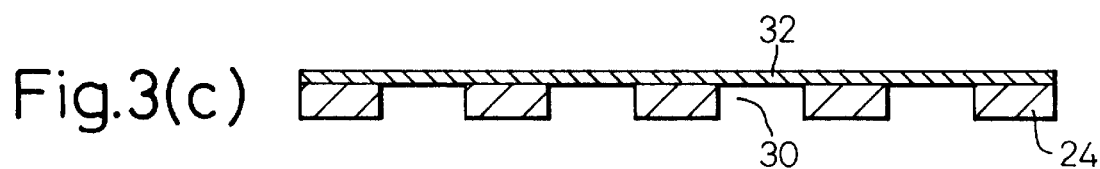

Then, a copper foil 32 is adhered to one of the surfaces of the base substrate 24, as shown in FIG. 3(c). The copper foil 32 is used for forming the lands 14 and has a thickness of 35 µm in the embodiment. Of course, any other conductive foil can also be used in place of the copper foil 32.

Figure 3D:
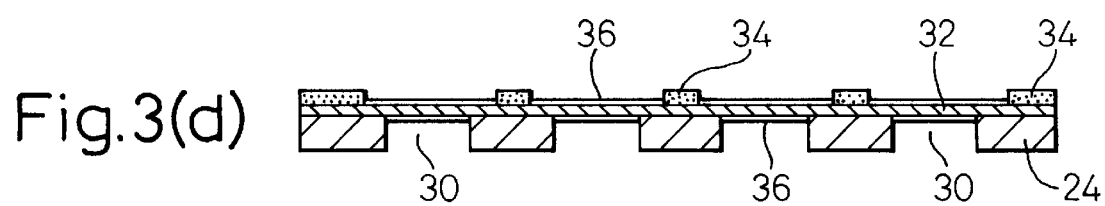

Then, the exposed surface of the copper foil 32 is coated with resist for plating and a resist pattern 34 is formed so as to expose the positions where the lands 14 are to be formed. Thus, an electroplating can be carried out using the resist pattern 34 as a masking, as shown in FIG. 3(d). The copper foil 32 is also exposed at the side on which the through holes 30 are formed.

Since the land 14 is formed to bridge the through hole 30, the resist pattern 34 is formed in such a manner that the copper foil is exposed at an area which corresponds to the position of the through hole and has a diameter of about 400 µm larger than that of the through hole 30.

When the electroplating process is carried out, the copper foil 32 can be used as a power supply layer. The electroplated layer 36 is used as a masking to etch the copper foil 36. To prevent the copper foil 36 from being affected by the etching acid, it is necessary to form such a plated film 36.

The plated film 36 may be a tin-lead eutectic alloy, or a gold plated layer using an electro-plated nickel layer as an underlayer.

Figure 3E:
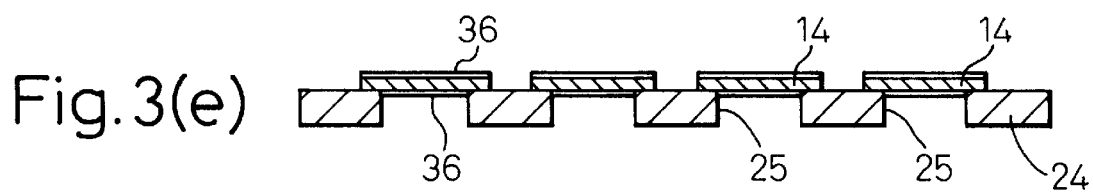

Then, the resist pattern is removed by dissolving and the copper foil is etched using the plated form 36 as a masking. The exposed portions of the copper foil 32 are removed by etching, so that the lands 14 are formed at the respective positions where the through holes 30 are formed and the base substrate 24 with the connecting holes 25 is thus provided, as shown in FIG. 3(e).

Figure 3F:
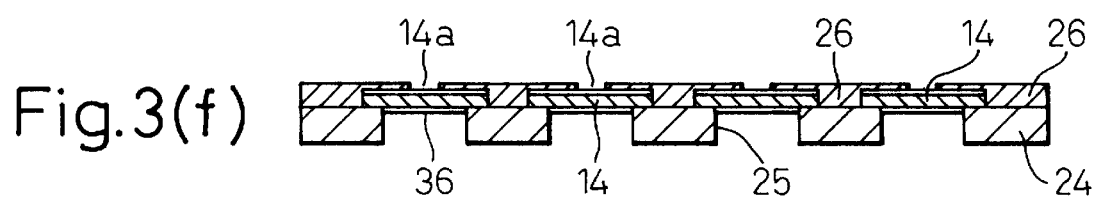

Finally, the photosensitive solder resist is coated as a protective film 26 on the surface of the base substrate 24 on which the lands 14 are formed. The solder resist is optically exposed and developed so that the lands 14 are exposed at only the connecting portions 14a thereon where the bumps 18 are to be in contact with the lands 14, as shown in FIG. 3(f).

A connecting board 22 is thus obtained in which the connecting hole 24 for providing the external connecting terminal 20 is opened at one surface of the land 14 and the contact portion 14a for the bump 18 is exposed at the other surface of the land 14.

Figure 3G:
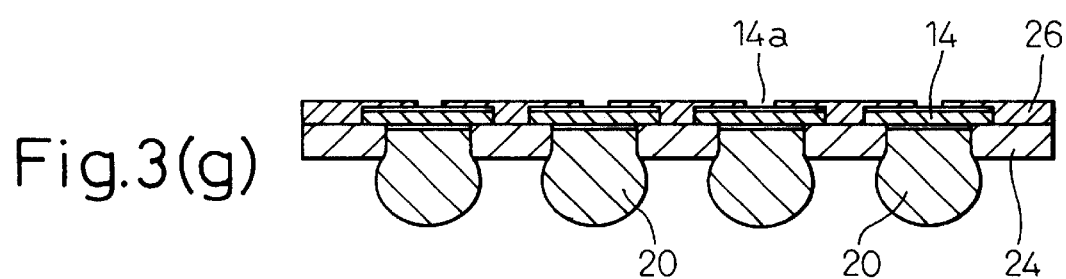

A semiconductor device can easily be made by using the connecting board 22 made as mentioned above. The semiconductor device can be made either by a process in which the semiconductor element 10 is first connected to the connecting board 22 and then the external connecting terminals 20 are provided, or by a process in which the semiconductor element 10 is connected to the connecting board 22 to which the external connecting terminals 20 have already been provided. FIG. 3(g) shows the connecting board 22 to which the external connecting terminals 20 are provided, before the semiconductor element 10 is mounted on the connecting board 22.

FIGS. 4(a) to 4(d) show a process for making a semiconductor device in which a semiconductor element 10 is first connected to the connecting board 22 and then the external connecting terminals 20 are provided.

Figure 4A:
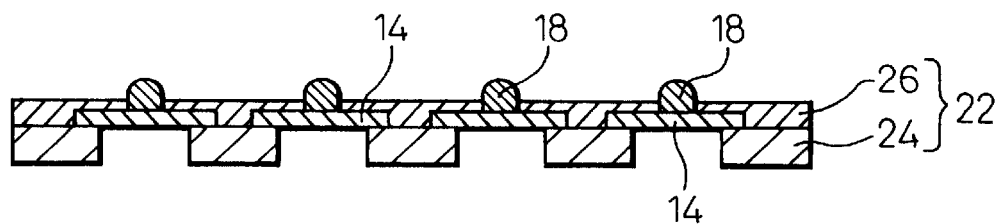
FIGS. 4(a) to 4(d) show respective steps for making a chip-sized semiconductor device according to this invention.

First, the bumps 18 for connecting the semiconductor element 10 are attached to the respective lands 14 of the connecting board 22, as shown in FIG. 4(a).

Figure 4B:
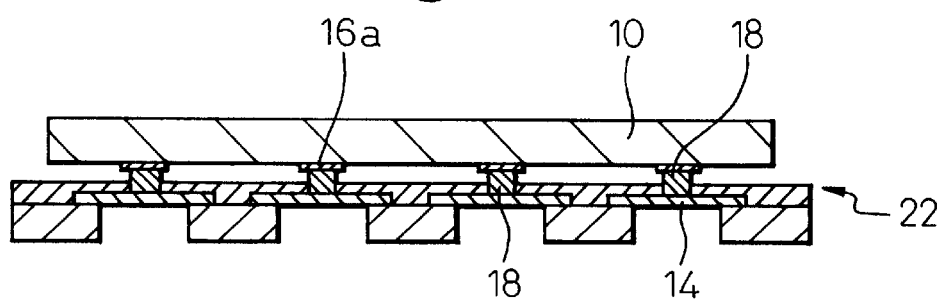

Then, the semiconductor element 10 and the connecting board 22 are positioned with respect to each other and the connecting board 22 is heated and adhered together with the semiconductor element 10 by means of bumps 18, as shown in FIG. 4(b). The bumps 18 connect the lands 14 to the respective connecting pads 16a formed on a surface of the semiconductor element 10.

Figure 4C:
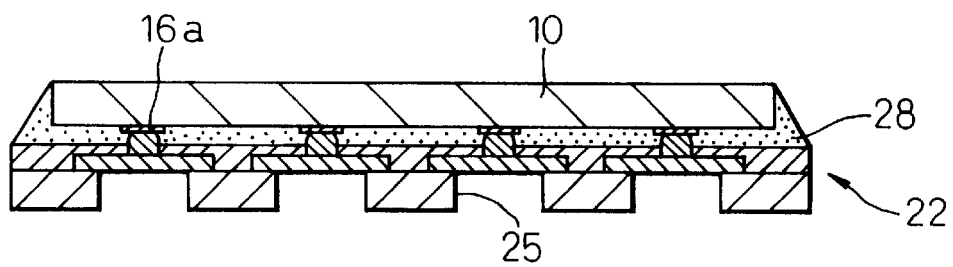

Then, an underfill material 28 is filled in the gap defined between the semiconductor element 10 and the connecting board 22, as shown in FIG. 4(c).

Figure 4D:
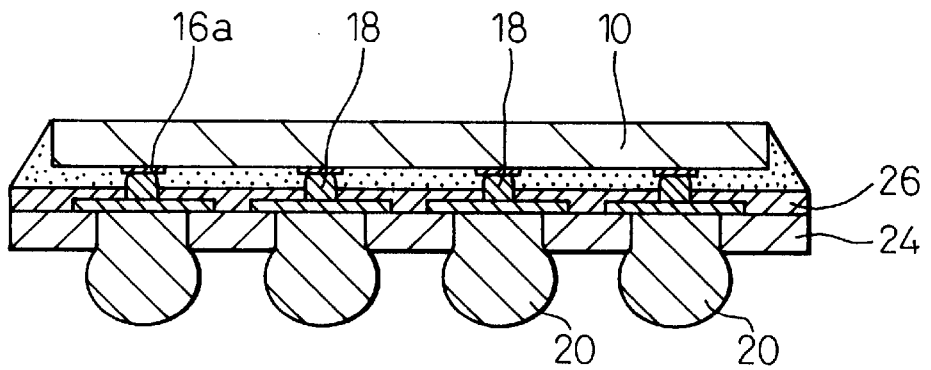
Figure 5:
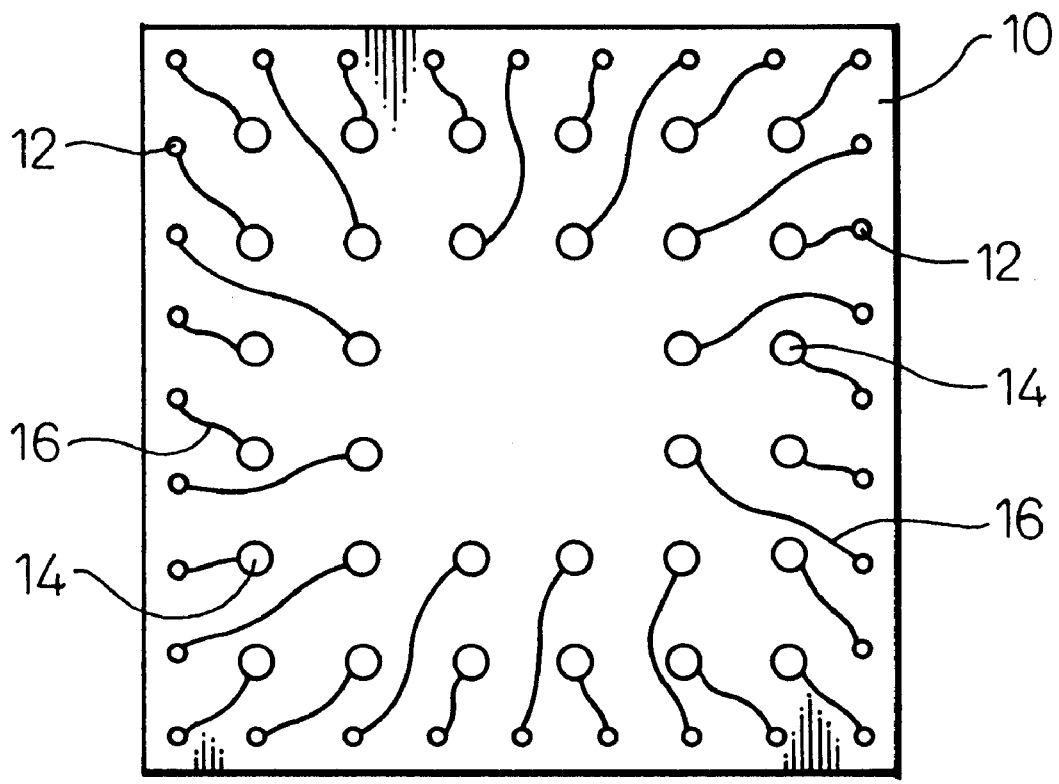
FIG. 5 shows an arrangement of external connecting terminals formed on the semiconductor chip.

Finally, the semiconductor device can thus be obtained by providing the external connecting terminals 20, such as solder balls, in the connecting holes 25 of the connecting board 22, as shown in FIG. 4(d).

The semiconductor device thus obtainable as mentioned above comprises a connecting board 22 which is adhered to the electrode forming surface of the semiconductor element 10 by means of the bumps 18 each having a smaller diameter than that of the external connecting terminals 20. Therefore, in this semiconductor device, a layout of the wiring patterns 16 on the electrode forming surface of the semiconductor element 10 can easily be made and also the external connecting terminals 20 can effectively arranged on the surface of the semiconductor element 10, thereby providing an effective multi-pin arrangement.

Since the base substrate 24 of the connecting board 22 is flexible, the thermal stress due to the difference in thermal expansion coefficient between the connecting board 22 and the semiconductor element 10 can be reduced and thus the reliability in mounting of semiconductor devices can be improved.

In addition, since the connecting board 22 is simple in structure, the connecting substrate 22 can easily be made. Also, since the semiconductor device according to the present invention can be made by a simple process in which the connecting board 22 is merely adhered to the semiconductor element 20 by means of the bumps 18, the semiconductor device itself can also easily be made.

It should be understood by those skilled in the art that the foregoing description relates to only some of the preferred embodiments of the disclosed invention, and that various changes and modifications may be made to the invention without departing from the spirit and scope thereof.

What is claimed is:

1. A chip-sized semiconductor device comprising:

a semiconductor element having a plurality of electrodes and a plurality of connecting pads electrically connected to said respective electrodes;

a connecting board comprising a base substrate having a first surface and a second surface, a plurality of connecting holes extending from said first surface to said second surface, a plurality of lands formed on said first surface to close said respective connecting holes, said lands being arranged in conformity with positions of said connecting pads of the semiconductor element, each of said connecting pads having a surface area smaller than that of said land;

said semiconductor element being mounted on said connecting board in such a manner that said connecting pads of the semiconductor element are electrically connected to said respective lands of the connecting board by means of a plurality of bumps, respectively; and a plurality of external connecting terminals on said second surface of the base substrate to be in contact with said respective lands through said respective connectings holes.

2. A semiconductor device as set forth in claim 1, wherein a plurality of wiring patterns are provided on an electrode forming surface of the semiconductor element to electrically connect said respective electrodes to said respective connecting pads.

3. A semiconductor device as set forth in claim 1, wherein said base substrate is made of an electrically insulating material, such as resin, and said first surface of the base substrate is covered with an electrically insulating protective film in such a manner that a part of said respective land is exposed to define a contact portion, to which said respective bump is to be adhered, said contact portion having a surface area smaller than that of said land.

4. A semiconductor device as set forth in claim 1, wherein a gap defined between said semiconductor element and said connecting board is filled with an electrically insulating underfill.

5. A chip-sized semiconductor device comprising:

a semiconductor element having a plurality of electrodes and a plurality of connecting pads electrically connected to said respective electrodes;

a connecting board comprising a base substrate having a first surface and a second surface, a plurality of connecting holes extending from said first surface to said second surface, a plurality of lands formed on said first surface to close said respective connecting holes, said lands being arranged in conformity with positions of said connecting pads of the semiconductor element, each of said connecting pads having a surface area smaller than that of said land; and said semiconductor element being mounted on said connecting board in such a manner that said connecting pads of the semiconductor element are electrically connected to said respective lands of the connecting board by means of a plurality of bumps, respectively.

6. A semiconductor device as set forth in claim 5, wherein a plurality of wiring patterns are provided on an electrode forming surface of the semiconductor element to electrically connect said respective electrodes to said respective connecting pads.

7. A semiconductor device as set forth in claim 5, wherein said base substrate is made of an electrically insulating material, such as resin, and said first surface of the base substrate is covered with an electrically insulating protective film in such a manner that a part of said respective land is exposed to define a contact portion, to which said respective bump is to be adhered, said contact portion having a surface area smaller than that of said land.

8. A semiconductor device as set forth in claim 5, wherein a gap defined between said semiconductor element and said connecting board is filled with an electrically insulating underfill.

9. A package for mounting thereon a semiconductor element, said package comprising:

a connecting board comprising a base substrate having a first surface and a second surface, a plurality of connecting holes extending from said first surface to said second surface, a plurality of lands formed on said first surface to close said respective connecting holes, said lands being arranged in conformity with positions of connecting pads of a semiconductor element which is to be mounted on said connecting board, each of said lands having a surface area larger than that of said connecting pads; and a plurality of external connecting terminals on said second surface of the base substrate to be in contact with said respective lands through said respective connectings holes.

10. A semiconductor device as set forth in claim 9, wherein said base substrate is made of an electrically insulating material, such as resin, and said first surface of the base substrate is covered with an electrically insulating protective film in such a manner that a part of said respective land is exposed to define a contact portion, said contact portion having a surface area smaller than that of said land.

11. A process for making a chip-sized semiconductor device, said process comprising the steps of:

preparing a connecting board comprising a base substrate having a first surface and a second surface, a plurality of connecting holes extending from said first surface to said second surface, a plurality of lands formed on said first surface to close said respective connecting holes, said lands being arranged in conformity with positions of connecting pads of a semiconductor element which is to be mounted on said connecting board, each of said lands having a surface area larger than that of said connecting pads;

mounting said semiconductor on said connecting board in such a manner that said connecting pads of the semiconductor element are electrically connected to said respective lands of the connecting board by means of a plurality of bumps, respectively; and providing a plurality of external connecting terminals on said second surface of the base substrate to be in contact with said respective lands through said respective connectings holes.

12. A process as set forth in claim 11, wherein said connecting board preparing step further comprises:

making said base substrate of an electrically insulating material, such as resin; and covering said first surface of the base substrate with an electrically insulating protective film in such a manner that a part of said respective land is exposed to define a contact portion, to which said respective bump is to be adhered, said contact portion having a surface area smaller than that of said land.

13. A process as set forth in claim 11 further comprising a step of filling a gap defined between said semiconductor element and said connecting board with an electrically insulating underfill.

14. A process for making a chip-sized semiconductor device, said process comprising the steps of:

preparing a connecting board comprising a base substrate having a first surface and a second surface, a plurality of connecting holes extending from said first surface to said second surface, a plurality of lands formed on said first surface to close said respective connecting holes, said lands being arranged in conformity with positions of connecting pads of a semiconductor element which is to be mounted on said connecting board, each of said lands having a surface area larger than that of said connecting pads;

providing a plurality of external connecting terminals on said second surface of the base substrate to be in contact with said respective lands through said respective connectings holes; and mounting said semiconductor on said connecting board in such a manner that said connecting pads of the semiconductor element are electrically connected to said respective lands of the connecting board by means of a plurality of bumps, respectively.

15. A process as set forth in claim 14, wherein said connecting board preparing step further comprises:

making said base substrate of an electrically insulating material, such as resin; and covering said first surface of the base substrate with an electrically insulating protective film in such a manner that a part of said respective land is exposed to define a contact portion, to which said respective bump is to be adhered, said contact portion having a surface area smaller than that of said land.

16. A process as set forth in claim 14 further comprising a step of filling a gap defined between said semiconductor element and said connecting board with an electrically insulating underfill.

* * * * *